United States Patent [19]

Nishida

[11] Patent Number: 4,783,689
[45] Date of Patent: Nov. 8, 1988

[54] PHOTODIODE HAVING HETEROJUNCTION

[75] Inventor: Katsuhiko Nishida, Tokyo, Japan

[73] Assignee: NEC Corporation, Tokyo, Japan

[21] Appl. No.: 938,353

[22] Filed: Dec. 4, 1986

Related U.S. Application Data

[63] Continuation of Ser. No. 553,943, Nov. 21, 1983, abandoned.

[30] Foreign Application Priority Data

Nov. 19, 1982 [JP] Japan .................. 57-203172

[51] Int. Cl.$^4$ ............................. H01L 33/00
[52] U.S. Cl. ................................. 357/17
[58] Field of Search ................... 357/17, 30

[56] References Cited

U.S. PATENT DOCUMENTS 4,382,265 5/1983 Pearsall ..................... 357/17

FOREIGN PATENT DOCUMENTS 0053513 3/1982 European Pat. Off. .

Primary Examiner—William L. Sikes
Assistant Examiner—Robert E. Wise
Attorney, Agent, or Firm—Sughrue, Mion, Zinn, Macpeak & Seas

[57] ABSTRACT

A semiconductor photodiode comprising an N+ InP substrate 6, a similar InP substrate layer 7, an N− InGaAs layer 8, a thin N-type InP layer 9, an N− InP layer 10 and a P+ InP region 11 forming the top of the photodiode. When reversed biased, the high electric field at the hetero-junction between the N− InGaAs and the N-type InP cause holes to tunnel through the band-gap difference barrier thereby eliminating slow trapping states at the hetero-interface.

1 Claim, 2 Drawing Sheets (a)

(b)

(c)

(a)

(b)

(c)

PHOTODIODE HAVING HETEROJUNCTION

This is a continuation of application Ser. No. 553,943 filed Nov. 21, 1983 and now abandoned.

BACKGROUND OF THE INVENTION

The present invention relates to an optical detector having a heterojunction, and more particularly to an avalanche photodiode.

The development of optical fiber communications technology has achieved rapid progress in recent years, and the transmission wavelength band it uses has been shifting from the 0.8 micron band to the 1 micron band where the transmission loss is minimized. Among optical receivers useful in this wavelength band is a type consisting of an InP substrate and, formed thereon, a crystalline heterojunction comprising InGaAs or InGaAsP and InP. In a photodiode or an avalanche photodiode for high-speed operation having a heterojunction made of such materials, the pn junction, subject to the highest electric field, is formed in InP whose bandgap is wider, in order to avoid a tunnel breakdown apt to occur in InGaAs or InGaAsP whose bandgap is narrow. However, a problem with optical detectors of such a structure is photocurrent components whose response is extremely slow. Thus, in optical detectors of this kind, frequency characteristics are observed to deteriorate in the region from several hundreds of kHz to several tens of MHz, and this phenomenon invites, in wide band optical transmission systems operating in the region of or above several MHz such as those used for optical communications, a sensitivity deterioration in a high frequency band and interference between codes owing to the slow current component.

This problem results from the fact that heterojunction type avalanche photodiodes of prior art are designed solely from the viewpoint of expanding the depletion layer of about 3 microns and above into the light absorbing region, and for the light absorbing layer of InGaAs, for example, a uniform impurity concentration of about $7 \times 10^{15}$ cm$^{-3}$ is used. As a consequence, the strength of the electric field on the hetero-interface becomes insufficient, inviting the trapping of the carrier as illustrated in FIG. 1(a).

Thus, to describe the band structure of the heterojunction type photodiode illustrated in FIG. 1(a), when a light beam having photon energy of $Eg1 > h\nu > Eg2$ comes in, light absorption occurs in a layer of a narrow band gap, resulting in the creation of pairs of electron-holes constituting photocarriers. In this case, the electrons move at high speed toward the N side because of the absence of an energy barrier. Meanwhile, the positive holes, faced with the energy barrier of $\Delta Eg \approx Eg1 - Eg2$ in the heterojunction, will be trapped by the hetero-barrier if, as illustrated, the electric field strength is too weak on the hetero-interface to give the holes sufficient kinetic energy to go beyond $\Delta Eg$. The holes thereby trapped will either be absorbed by recombination in the hetero-interface region, or go beyond the barriers by a thermal excitation process to constitute a slow response component having a large time constant.

SUMMARY OF THE INVENTION

An object of the present invention is to eliminate the deterioration of frequency characteristics observed in the heterojunction type optical detectors of the prior art and to provide a high-speed, high-sensitivity optical detector.

According to the invention, a semiconductor photodiode having a semiconductor heterojunction and a PN junction comprises:

a semiconductor substrate of a first conductivity type; a first semiconductor layer of the first conductivity type formed over a surface of the substrate, the first semiconductor layer serving as a light absorbing region; a second semiconductor layer of the first conductivity type formed over the first semiconductor layer, the second semiconductor layer having a wider bandgap than that of the first semiconductor layer; a third semiconductor layer of a second conductivity type formed over the second semiconductor layer, the third semiconductor layer having a wider bandgap than that of the first semiconductor layer; and a fourth semiconductor layer of the first conductivity type, diposed between the first and second semiconductor layers, having a thickness of less than 0.1 micron and a larger impurity concentration than that of at least one of the first and second semiconductor layers.

Thus, the present invention is intended to achieve loss-free high-speed transport of the photocarrier by improving the impurity concentration distribution of the semiconductor layers constituting the heterojunction, and increasing the impurity concentration of only the thin region or regions, measuring about 0.1 micron in width, of either one or both of the semiconductor layers which are in contact with the heterojunction.

The photocarrier can be transported at high speed and without loss of sensitivity owing to the extinction of the carrier by either strengthening the electric field on the hetero-interface as illustrated in FIG. 1(b) and thereby giving the light excited positive holes sufficient kinetic energy to go beyond the heterobarrier or by increasing the band inclination as illustrated in FIG. 1(b) and thereby giving a tunnel effect to let them pass. The energy condition that makes possible the high-speed transportation of the photocarrier as shown in FIG. 1(b) can be achieved with an improved structure in which a high-concentration layer is locally inserted, instead of the traditional uniform concentration distribution of impurities.

Since the field strength is, as is given by Poisson's formula, proportional to the electric charge in the depletion layer or the integrated value of the quantities of ionized impurities, increasing their concentration results in a stronger electric field. However, there also are the problems that a higher impurity concentration invites a narrow width of the depletion layer and a smaller light absorbing region, with a corresponding drop in sensitivity, and that a tunnel breakdown would occur in a semiconductor like InGaAs whose bandgap is narrow. These problems can be solved by raising the impurity concentration only in the hetero-interface region. As a carrier drifting across a strong electric field is likely to be scattered in various ways, its kinetic energy cannot be raised beyond a certain limit. The distance in which this kinetic energy becomes saturated is no more than about 0.1 micron, and at or around 100 Å the presence of carriers drifting unscattered becomes greater.

Further, if the field strength is increased to at least several hundreds of kV/cm at or below approximately 100 Å, the tunnel effect will give the carrier a greater probability of passing the barrier. Thus, since the high concentration region need not be very large, but a width of at most 0.1 micron or so would be great enough for it and the decrease of the depletion layer expansion can be kept unsubstantial by making the region thin enough, the requirements for high speed and high sensitivity can be simultaneously satisfied.

DETAILED DESCRIPTION OF THE PREFERRED EMBODIMENTS

Figure 2:
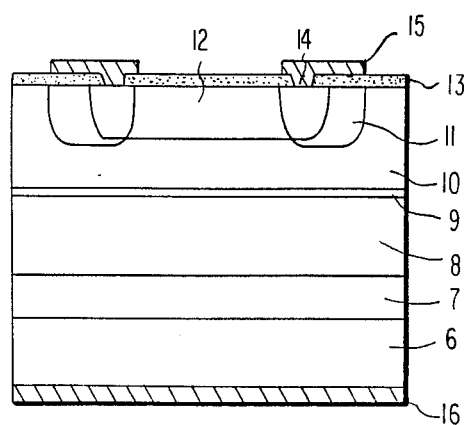
FIG. 2 shows a cross section of a heterojunction type optical detector, which is a first preferred embodiment of the invention.

The structure and process of the present invention will be described below with reference to FIG. 2.

After an N+ type InP layer 7 of several microns in thickness is formed over an N+ type InP substrate 6 having a face (100) by an epitaxial growth process (for instance by the gas phase epitaxial process), an N− type InGaAs layer of about 4 microns in thickness and $3\times10^{15}$ cm$^{-3}$ in impurity concentration is formed. Next, an N type InP layer 9 of about 0.1 micron in thickness and $5\times10^{16}$ cm$^{-3}$ in concentration is formed by adding Se or S as an impurity, and finally an N− type InP layer 10 of about 4 microns in thickness and $8\times10^{15}$ cm$^{-3}$ in impurity concentration is formed. After forming a film of SiO$_2$ or Si$_3$N$_4$ on the surface of the wafer thereby produced by the gas phase growth process or the sputtering method, the SiO$_2$ or Si$_3$N$_4$ film is selectively removed in a concentrical circle shape by the photolithographic process (not illustrated). Then, by use of an ion implantation technique, Be atoms from the Be ion source are implanted at an accelerating voltage of around 100 kV through the exposed parts of the concentric circle-shaped InP layer into the InP layer. Next, after removing the SiO$_2$ or Si$_3$N$_4$ film, a ring-shaped P type InP region 11 is formed in the N− InP layer by thermal treatment at 700° C. under phosphorus pressure. Then, after forming an SiO$_2$ or Si$_3$N$_4$ film again on this wafer, the circular region which does not go beyond the periphery of the concentric circle is removed by the photolithographic process. Next, by arranging Cd$_3$P$_2$ used as the source of diffusion together with the wafer in an evacuated closed tube and conducting thermal treatment at around 570° C. for about 40 minutes, a P+ InP region 12 of about 2 microns in depth is formed by the selective diffusion of Cd. Then an Si$_3$N$_4$ or SiO$_2$ film 13 is formed all over the wafer as before and, after an electrode access window 14 is formed in said Cd-diffused region 12 by the photolithographic process, a P type AuZn electrode 15 is formed by the photolithographic process. By forming next an N type AuGe electrode 16 on the InP substrate 6, the illustrated optical detector according to the present invention can be provided.

Incidentally, the impurity concentration of the N+ and P+ regions, which are resistance regions, need not be greater than about $10^{18}$ cm$^{-3}$. The N+ type InP layer 7, which is provided as a buffer layer, is not absolutely required as long as the substrate is of the N+ type.

Figure 1A:
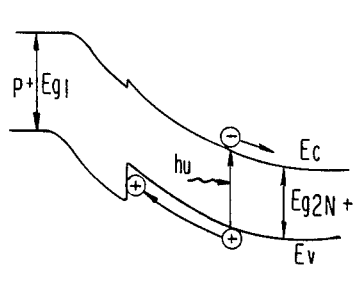
FIG. 1(a) illustrates the hetero-band structure of a conventional heterojunction type optical detector when back biased and the mode in which the carrier is transported thereby.
Figure 1B:
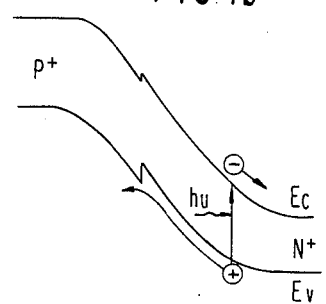
FIG. 1(b) illustrates the hetero-band structure of a heterojunction type optical detector according to the present invention when back biased and the mode in which the carrier is transported thereby.
Figure 3:
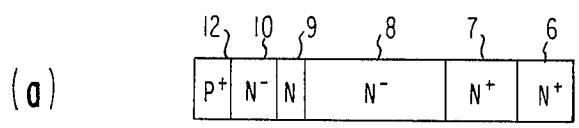
FIG. 3 shows the impurity concentration distribution (b) and the principal part of the band structure (c) of the first embodiment of the invention together with its layered structure (a)
Figure 3:
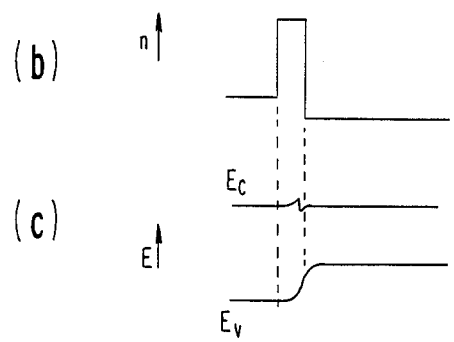

Referring now to FIG. 3, an impurity concentration n and a band structure in a non-biased state are illustrated in (b) and (c), respectively, with respect to the N type InP layer 9 and the adjoining layers on both sides, together with the semiconductor layer structure shown in (a). If negative and positive voltages are fed to the P+ and N+ sides, respectively, there will result the band structure of FIG. 1(b) when back biased or, if light is brought incident from the P+ side, the structure can be operated as a photodiode or an avalanche photodiode. Thus, the presence of the InP layer 9 enables the positive holes generated in said InGaAs layer 8 to achieve a fast response of 1 GHz or above owing to the tunnel effect. This stratified structure can provide a high quantum efficiency of 80% or above in the wavelength range of 1 micron to 1.65 microns.

Figure 4:
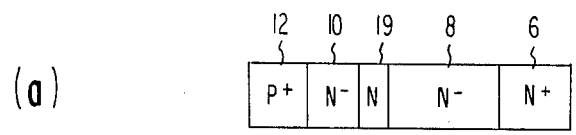
FIG. 4 refers to a second preferred embodiment of the invention, wherein (a) illustrates its layered structure, (b) its impurity concentration distribution and (c) its band structure, and FIG. 5 refers to a third preferred embodiment of the invention, wherein (a) illustrates its layered structure, (b) its impurity concentration distribution and (c) its band structure.
Figure 4:
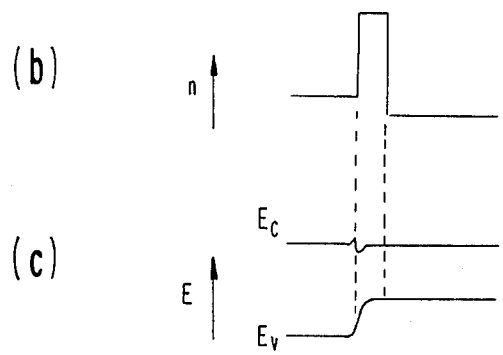

Next will be described the second preferred embodiment of the present invention with reference to FIG. 4. FIG. 4(a) illustrates the semiconductor layer structure of the embodiment that is, the layered structre of the optical detector, comprising an N+ type InP substrate 6 together with an N− type InGaAs layer 8 of $n=3\times10^{15}$ cm$^{-3}$, an N type InGaAs layer 19 of $n=10^{16}$ cm$^{-3}$, an N− type InP layer 10 and a P+ type InP layer 12 both of $n=8\times10^{15}$ cm$^{-3}$, all grown over the substrate. The impurity concentration and band structure of this optical detector are shown in FIGS. 4(b) and (c), respectively. The desirable widths for the individual layers are 4 microns for the layer 8, 0.1 micron for the layer 19 and 2 microns for the layer 4, all values given approximately. The impurity concentrations for other layers are substantially the same as those described for the first preferred embodiment with reference to FIG. 2.

This embodiment makes it possible to impress a strong electric field of nearly 200 kV/cm on the hetero-interface and thereby to transport holes, optically generated with high energy, toward the P+ side. In this layered structure, if light is brought incident from either the P+ or the N+ side, a high quantum efficiency of about 80% or above can be achieved in a wavelength range of 1 to 1.65 microns.

Figure 5:
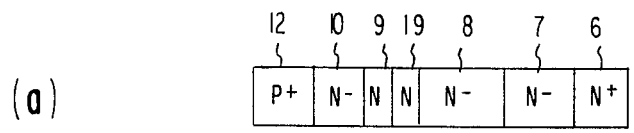
Figure 5:
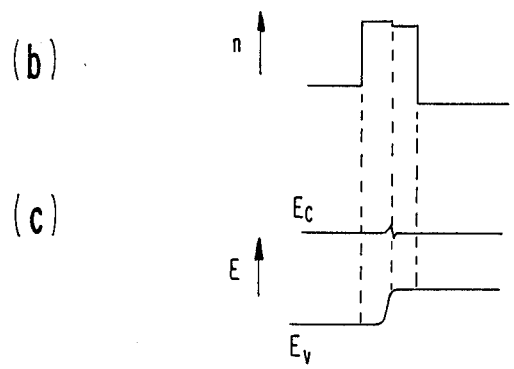

Referring now to FIG. 5, the third preferred embodiment of the present invention achieves a high degree of responsiveness by the combination of the two effects described with reference to the first (FIG. 3) and second (FIG. 4) embodiments, namely by increasing the impurity concentrations on both sides of the heterojunction. A layer 19, measuring 0.1 micron in width, consists of InGaAs of $n=10^{16}$ cm$^{-3}$ and a layer 9, 100 Å wide, is made of InP of N≳$5\times10^{16}$ cm$^{-3}$, while 6, 8, 10 and 12 are N+ InP, N− InGaAs, N− InP and P+ InP layers, respectively. The impurity concentrations and widths of the individual layers not stated above are substantially the same as in the embodiment illustrated in FIG. 2.

The impurity concentration distribution and band structure are illustrated in FIGS. 5(b) and (c), respectively, together with the layered structure.

Although the production processes of the second and third embodiments were omitted to simplify the description, these embodiments can be produced by substantially the same process as that for the first embodiment.

Whereas ΔEg is about 0.6 eV in the heterojunction of InP and InGaAs in the foregoing embodiments, the formation of the above described concentration distribution enables the photocarrier to be transported at high speed in spite of such a great heterobarrier, so that there can be provided a high-speed optical detector which is responsive even at 1 GHz or above.

The concept of the present invention can obviously be applied also to other heterojunction type optical detectors than the foregoing embodiments. For instance, it would be as effective to compose the layer 8 in FIG. 2 out of a semiconductor having a medium bandgap, such as InGaAsP, and the invention can as well be applied generally to other combinations of hetero-structures having heterobarriers of 0.2 eV or above.

While the above embodiments are explained with a PN junction, a Schottky junction may be used instead of the PN junction.

What is claimed is:

1. A semiconductor photodiode having a semiconductor heterojunction and a PN junction, comprising:
   a semiconductor substrate of a first conductivity type;
   a light absorbing region of the first conductivity type formed over a surface of the substrate, for absorbing light to thereby generate photocarriers;
   an avalanche multiplying region of the first conductivity type formed over the light absorbing region for avalanche-multiplying injected carriers from said light absorbing region; and
   a semiconductor region of a second conductivity type formed over the avalanche multiplying region, and having a wider bandgap than that of the light absorbing region and constituting a PN junction together with the avalanche multiplying region;
   wherein the avalanche multiplying region includes a first semiconductor layer and a second semiconductor layer arranged in this order over the light absorbing region, the second semiconductor layer having a wider bandgap than that of the absorbing region, the first semiconductor layer of the first conductivity type having a thickness of less than 0.1 micron and an impurity concentration equal to or above $5 \times 10^{16}$ cm$^{-3}$ which is larger than that of the second semiconductor layer and a bandgap of the first semiconductor layer being not larger than that of the second semiconductor layer;
   said photodiode further comprising a third semiconductor layer of the first conductivity type formed between the light absorbing region and the first semiconductor layer to constitute a heterojunction together with the first semiconductor layer and having a thickness of less than 0.1 micron and a larger impurity concentration than that of the absorbing region, and a bandgap of the third semiconductor layer being smaller than that of the first semiconductor layer.

* * * * *

UNITED STATES PATENT AND TRADEMARK OFFICE
CERTIFICATE OF CORRECTION

PATENT NO. : 4,783,689
DATED : November 8, 1988
INVENTOR(S) : NISHIDA

It is certified that error appears in the above-identified patent and that said Letters Patent is hereby corrected as shown below:

Column 4, line 26, delete "stratified" and insert --layered--.
Column 4, line 32, delete "structre" and insert --structure--.

Signed and Sealed this

Twentieth Day of June, 1989

Attest:

DONALD J. QUIGG

Attesting Officer

Commissioner of Patents and Trademarks